United States Patent [19]
Lebby et al.

[11] Patent Number: 5,351,257
[45] Date of Patent: Sep. 27, 1994

[54] VCSEL WITH VERTICAL OFFSET OPERATING REGION PROVIDING A LATERAL WAVEGUIDE AND CURRENT LIMITING AND METHOD OF FABRICATION

[75] Inventors: Michael S. Lebby, Apache Junction; Chan-Long Shieh, Paradise Valley, both of Ariz.; Donald E. Ackley, Lambertville, N.J.

[73] Assignee: Motorola, Inc., Schaumburg, Ill.

[21] Appl. No.: 28,015

[22] Filed: Mar. 8, 1993

[51] Int. Cl.[5] ............................ H01S 3/05; H01S 3/19
[52] U.S. Cl. .......................................... 372/46; 372/45; 372/48; 372/96
[58] Field of Search ................... 372/48, 45, 46, 50, 372/96, 94

[56] References Cited

U.S. PATENT DOCUMENTS

| | | | |
|---|---|---|---|
| 4,608,695 | 8/1986 | Oda et al. | 372/46 |
| 4,675,876 | 6/1987 | Svilans | 372/45 |
| 4,819,243 | 4/1989 | Opschoor | 372/45 |
| 4,873,696 | 10/1989 | Coldren et al. | 372/46 |
| 4,943,970 | 7/1990 | Bradley | 372/46 |
| 5,212,701 | 5/1993 | Choquette et al. | 372/46 |
| 5,245,622 | 9/1993 | Jewell et al. | 372/45 |

Primary Examiner—Rodney B. Bovernick
Assistant Examiner—Robert McNutt
Attorney, Agent, or Firm—Eugene A. Parsons

[57] ABSTRACT

A VCSEL including a first mirror stack, an active region and a second mirror stack positioned on a substrate with portions of the active region and the first and second mirror stacks being offset from surrounding portions by an offset area in the surface of the substrate so as to define a lateral waveguide which confines the operating region of the VCSEL. The surrounding portions of the second mirror stack are removed to provide current control and refractory metal contacts are formed on the upper and lower surfaces. Methods of fabricating the offset as a depression or a mesa in the surface of the substrate and the resulting VCSEL are disclosed.

26 Claims, 4 Drawing Sheets

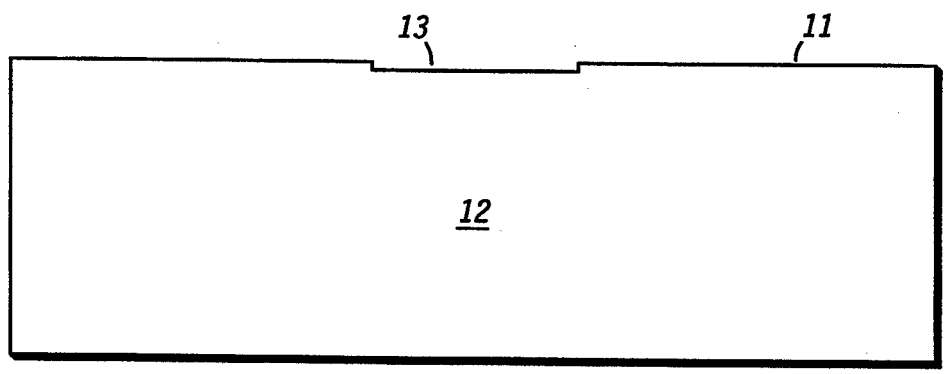
FIG. 1
FIG. 2
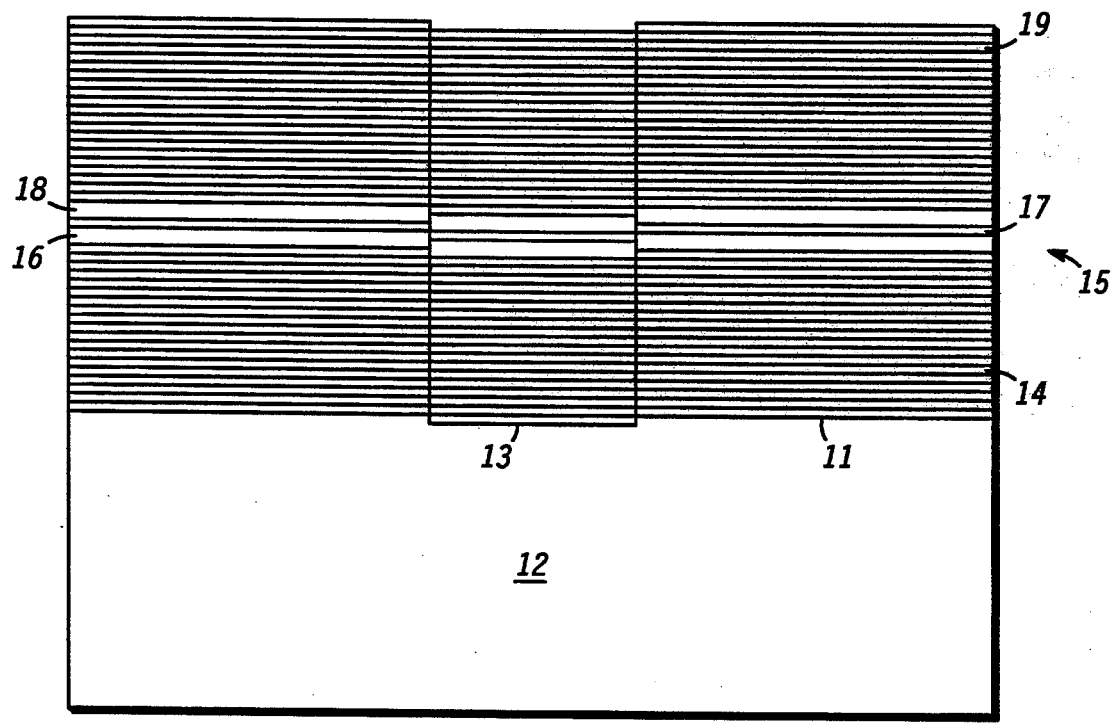

VCSEL WITH VERTICAL OFFSET OPERATING REGION PROVIDING A LATERAL WAVEGUIDE AND CURRENT LIMITING AND METHOD OF FABRICATION

FIELD OF THE INVENTION

The present invention pertains to vertical cavity surface emitting lasers and more specifically to high efficiency vertical cavity surface emitting lasers.

BACKGROUND OF THE INVENTION

In general, vertical cavity surface emitting lasers (VCSEL) are constructed by providing a substrate with very smooth surface. A first stack of mirrors is then grown on the surface by semiconductor manufacturing techniques. An active area is grown on the upper surface of the first mirror stack and a second mirror stack is grown on the upper surface of the active area. Generally, metal contacts formed of an easily deposited metal, such as gold, titanium, tungsten, platinum, or the like, are provided. In general, one metal contact is provided on the surface of the first (lower) mirror stack and a second metal contact on the upper surface of the second mirror stack. The problem is that these metals are very expensive and add greatly to the ultimate cost of the device.

The major problems that occur are to contain the lasing, or optical mode to a lowest order mode and to contain current flow to approximately the volume of the VCSEL in which lasing is occurring. Higher order lasing and extraneous flow of current outside the lasing area produces heat in the VCSEL and causes a substantial loss of power. One method utilized to contain current flow to a desired area is to provide implants of materials which reduce or prevent current flow in the implanted area, or produce reverse biased diodes. The problem with this solution is that implants require a very high acceleration voltage, in some instances 400 kV or more, and are easily disbursed by subsequent operations.

SUMMARY OF THE INVENTION

It is a purpose of the present invention to provide a VCSEL which is more efficient than prior VCSELs.

It is a further purpose of the present invention to provide a VCSEL with improved modal and current confinement.

The above problems and others are substantially solved and the above purposes and others realized by a vertical cavity surface emitting laser having an operating wavelength at which light emission occurs, the laser including a supporting substrate having a surface lying in a first plane and a substantially centrally located offset area of the surface lying in a second plane parallel to the first plane and spaced therefrom, a first mirror stack positioned on the surface of the substrate so as to overlie the offset area and a portion of the surface surrounding the offset area, an active region including at least a layer positioned parallel and in overlying abutting engagement with the first mirror stack and substantially coextensive therewith, a second mirror stack positioned parallel and in overlying abutting engagement with the active region and substantially overlying only the offset area, and first portions of the active region and the first mirror stack being offset from second surrounding portions of the active region and the first mirror stack by the offset area in the surface of the substrate so as to define a lateral waveguide generally aligned with the second mirror stack.

Further, the above problems and others are substantially solved and the above purposes and others realized by a method of manufacturing a vertical cavity surface emitting laser having an operating wavelength at which light emission occurs, the method including the steps of providing a supporting substrate having a surface lying in a first plane, forming a substantially centrally located offset area in the surface lying in a second plane parallel to the first plane and spaced therefrom, positioning a first mirror stack on the surface of the substrate so as to overlie the offset area and a portion of the surface surrounding the offset area, positioning an active region including at least a layer parallel and in overlying abutting engagement with the first mirror stack and substantially coextensive therewith, positioning a second mirror stack parallel and in overlying abutting engagement with the active region and substantially coextensive therewith, further positioning the first and second mirror stacks and the active region so that first portions of the active region and the first and second mirror stacks are offset from second surrounding portions of the active region and the first and second mirror stacks, respectively, by the offset area in the surface of the substrate so as to define a lateral waveguide, and removing portions of the second mirror stack overlying the portions of the surface surrounding the offset area.

BRIEF DESCRIPTION OF THE DRAWINGS

Referring to the drawings:

FIGS. 1 - 6 are cross-sectional views of sequential steps in the formation of one embodiment of a VCSEL incorporating the present invention.

DESCRIPTION OF THE PREFERRED EMBODIMENT

Figure 3:
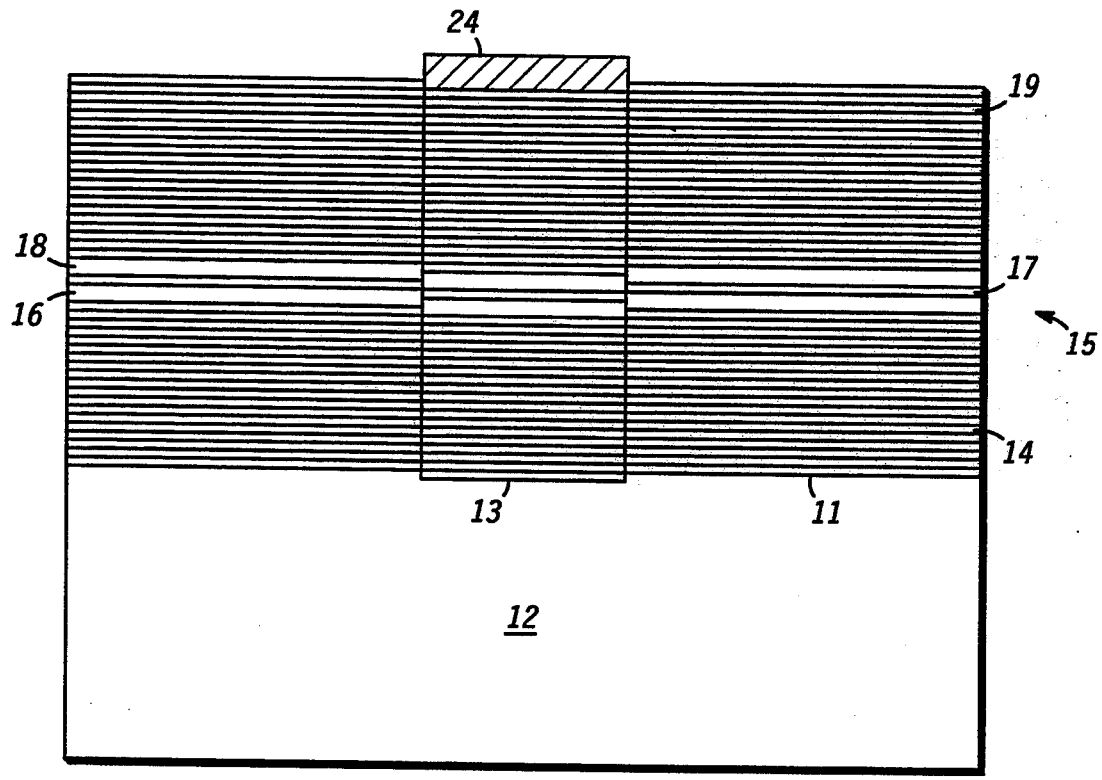

Referring specifically to FIG. 1, a first step in the process is illustrated, wherein a substrate 12 is provided. Substrate 12, in this example, is made of n-doped gallium arsenide. Gallium arsenide is used as substrate 12 to facilitate epitaxial growth of multiple layers of aluminum gallium arsenide and aluminum gallium arsenide with periodic high and low mole fractions of aluminum. An offset area 13, which in this specific embodiment is a depression, is formed in a central location in an upper surface 11 of substrate 12. Typically, offset area 13 is provided by masking surface 11 of substrate 12 with a photoresist or the like and performing a wet etch. While etching is a preferred method of forming offset area 13, it should be understood that other methods might be utilized with the important feature being that the surface of offset area 13 lie generally in a plane parallel with a plane through surface 11 but spaced, or offset, therefrom.

Offset area 13, in this specific embodiment, is round and has a diameter approximately equal to the mode size for the lowest order of operating mode for the VCSEL being produced. For reasons which will be explained presently, the depth of offset area 13, or the amount that the surface of offset area 13 is offset from surface 11, is approximately a quarter of a wavelength of the operating frequency of the VCSEL to be produced. As will be understood from the following explanation, the offset can be any desired odd multiple of one quarter wavelength, but a single one quarter wavelength is chosen here for simplicity of construction and understanding.

Epitaxial deposition of multiple alternate layers of different compositions is accomplished by well known techniques in the art such as MBE, MOCVD, CBE, MOMBE or the like. These techniques enable epitaxial deposition of relatively thin and thick layers of a variety of materials such as gallium arsenide, aluminum gallium arsenide, aluminium arsenide, indium gallium arsenide, indium gallium aluminum arsenide, indium phosphide or the like. Fabrication of VCSEL devices use epitaxial deposition extensively to produce the multitude of layers of different materials which make up the device.

As illustrated in FIG. 2, deposition of alternating layers of doped aluminum gallium arsenide and aluminum gallium arsenide with periodic high and low mole fractions of aluminum form a first stack 14 of reflectors or mirrors on surface 11 of substrate 12. First stack 14 is positioned so as to overlie offset area 13 and a surrounding portion of surface 11. Thicknesses of alternating layers of aluminum gallium arsenide and aluminum gallium arsenide with periodic high and low mole fractions of aluminum are set at approximately one quarter of the wavelength at which the device is designed to operate. Nominal thicknesses for the aluminum gallium arsenide layers and the aluminum gallium arsenide with periodic high and low mole fractions of aluminum layers are on the order of 610 angstroms and 640 angsttoms, respectively.

A typical active region 15 is formed as follows, so as to overlie first stack 14 and be approximately coextensive therewith. A first cladding layer 16 is epitaxially deposited on first mirror stack 14 to form a first major surface of active region 15. Cladding layer 16 is typically composed of aluminum gallium arsenide of composition intermediate to the two compositions used in the first mirror stack. An active layer 17, which consists of a single GaAs quantum well (or multiple GaAs quantum wells, separated by 100 A barriers of aluminum gallium arsenide) is then epitaxially deposited on cladding layer 16. A second cladding layer 18 of the same aluminum gallium arsenide composition and thickness as cladding layer 16 is then epitaxially deposited on active layer 17. The total thickness of active region 15 is chosen to be an integral multiple of a half wavelength of the optical emission in the semiconductor material. The overall thickness of first cladding layer 16, active layer 17 and second cladding layer 18 is approximately the length of a full wavelength at the lesser emission propagating in active region 15.

A second stack 19 of reflectors or mirrors is epitaxially deposited on the surface of second cladding layer 18 of active region 15 so as to be approximately coextensive therewith. Second mirror stack 19 is composed of alternating layers of beryllium or carbon doped aluminum gallium arsenide and aluminum gallium arsenide with periodic high and low mole fractions of aluminum. Thickness of the last alternating layer is approximately one half-wavelength instead of one quarter-wavelength as is used for the other alternating layers. Generally, the threshold current of a VCSEL is reduced by increasing the number of alternating layers in mirror stacks 14 and 19.

Each of first mirror stack 14, active region 15 and second mirror stack 18 generally follow the contours of surface 11 and offset area 13 which they overlie. Thus, each layer in first mirror stack 14, active region 15 and second mirror stack 19 includes an offset of approximately one quarter wavelength directly above the edges, or outer limit, of offset area 13. Since each layer in first and second mirror stacks 14 and 19 is approximately one quarter wavelength thick, the portion of each layer which overlies offset area 13 is substantially aligned with, or bounded by, the portion of the next succeeding layer which overlies surface 11 surrounding offset area 13. Further, alternating layers of aluminum gallium arsenide and aluminum gallium arsenide with periodic high and low mole fractions of aluminum are used to form mirror stacks 14 and 19. Thus, for example, each layer of aluminum gallium arsenide is bounded at the offset by the next layer of aluminum gallium arsenide with periodic high and low mole fractions of aluminum and each layer of aluminum gallium arsenide with periodic high and low mole fractions of aluminum is bounded at the offset by the next layer of aluminum gallium arsenide.

Aluminum gallium arsenide with periodic high and low mole fractions of aluminum has an index of refraction of approximately 3.3 and aluminum gallium arsenide has an index of refraction of approximately 3.5. Each layer of aluminum gallium arsenide with a high index of refraction is bounded by aluminum gallium arsenide with periodic high and low mole fractions of aluminum with a low index of refraction. This change in the index of refraction at the offset results in virtually total internal reflection of light. While the low index of refraction layers are bounded by high index of refraction material, the high angle reflectivity is still greater than approximately 80%. Further, active layer 17 is offset so that it is bounded by cladding layer 18, which results in virtually total internal reflection of light at the source. Thus, the offset in each layer produced by mesa 13 essentially produces a built-in lateral waveguide that extends from the junction of offset area 13 and surface 12 to the upper surface of second mirror stack 19. From a mode picture, the peaks of the optical field outside of the offset region no longer line up properly with active layer 17 or the mirror interface, leading to modal confinement due to the phase and gain mismatches. Thus, the change in the index of refraction at the offset, which defines the built-in lateral waveguide, also substantially defines the operating volume in which lasing occurs.

Referring specifically to FIG. 3, the structure illustrated in FIG. 2 is patterned, by some convenient means such as photoresist or the like, so that only the area directly above offset area 13 is exposed. An etch mask 24 is formed in the exposed area, which etch mask 24 preferably includes a sputtered/conformal metal such as TiWNx. In some types of etching and/or special applications a layer of TiWNx will not be sufficient to completely resist the etch step to follow. In such instances, other and/or additional layers may be utilized in etch mask 24, which layers may include photoresist, silicon nitride, or combinations thereof, e.g., TiWNx, TiWNx + photoresist, TiWNx + silicon nitride, TiWNx + photoresist + silicon nitride, etc.

With etch mask 24 in place and the remainder of second mirror stack 19 exposed, the structure is placed in a reactive ion etch system, such as that disclosed in U.S. Pat. No. 5,034,092, entitled "Plasma Etching of Semiconductor Substrates", issued Jul. 23, 1991. While other etch systems might be utilized, such as RIBE (reactive ion beam etching), CAIBE (chemically assisted ion beam etching) and IBAGSC (disclosed in U.S. Pat. No. 5,116,461, entitled Method for Fabricating an Angled Diffraction Grating, issued May 26, 1992) the above system is preferred because of the control, high degree of anisotropy and small amount of damage. As illustrated specifically in FIG. 4, the etch continues until the portions of second mirror stack 19 surrounding the offset are removed to upper cladding layer 18.

An etch stop layer 25 is provided in this embodiment to facilitate stopping of the etch process prior to reaching second cladding layer 18. When utilized with the reactive ion etch system described above, a number of different etch stop layers are available. For example, etch stop layer 25 is a layer of InGaP with a thickness in the range of approximately 50 - 200A. Other materials which might be utilized include InAlAs and InGaAlAs, when the latter is lattice matched to the GaAs and AlGaAs in the structure. It should be noted that etch stop layer 25 is utilized for convenience and that when the etch step can be accurately stopped, which is possible using laser interferometry as is commonly known in the art, without using an etch stop layer, no such layer need be included.

Figure 4:
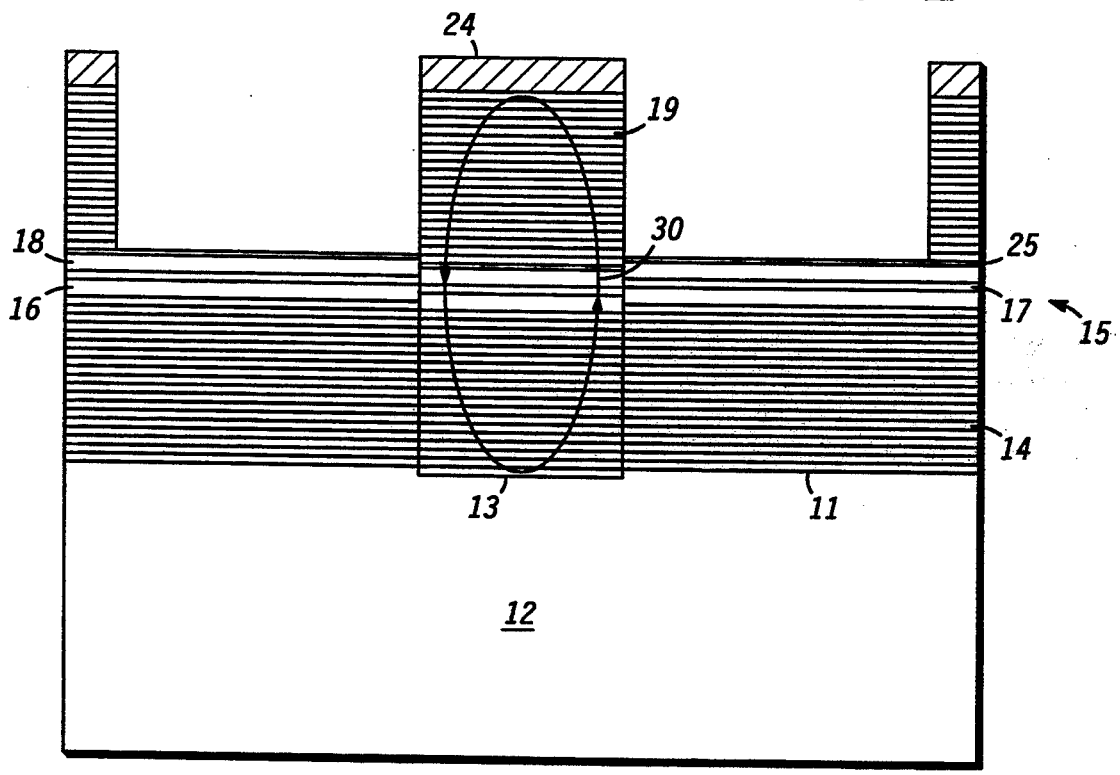

As a result of the above process, the optical mode, illustrated diagramatically by circular arrows 30, effectively has increased guiding in the vertical direction, which substantially improves performance. The volume above offset area 13 generally defines the volume of the VCSEL within which lasing occurs because of the change in index of refraction produced by the offset between offset area 13 and surface 11. Further, by etching second mirror stack 19 as illustrated in FIG. 4, current flow is substantially confined within the VCSEL to the lasing volume generally coaxial with and above offset area 13. By controlling current distribution to only the desired lasing volume a minimum of current is wasted and the efficiency of the VCSEL is maximized.

Figure 5:
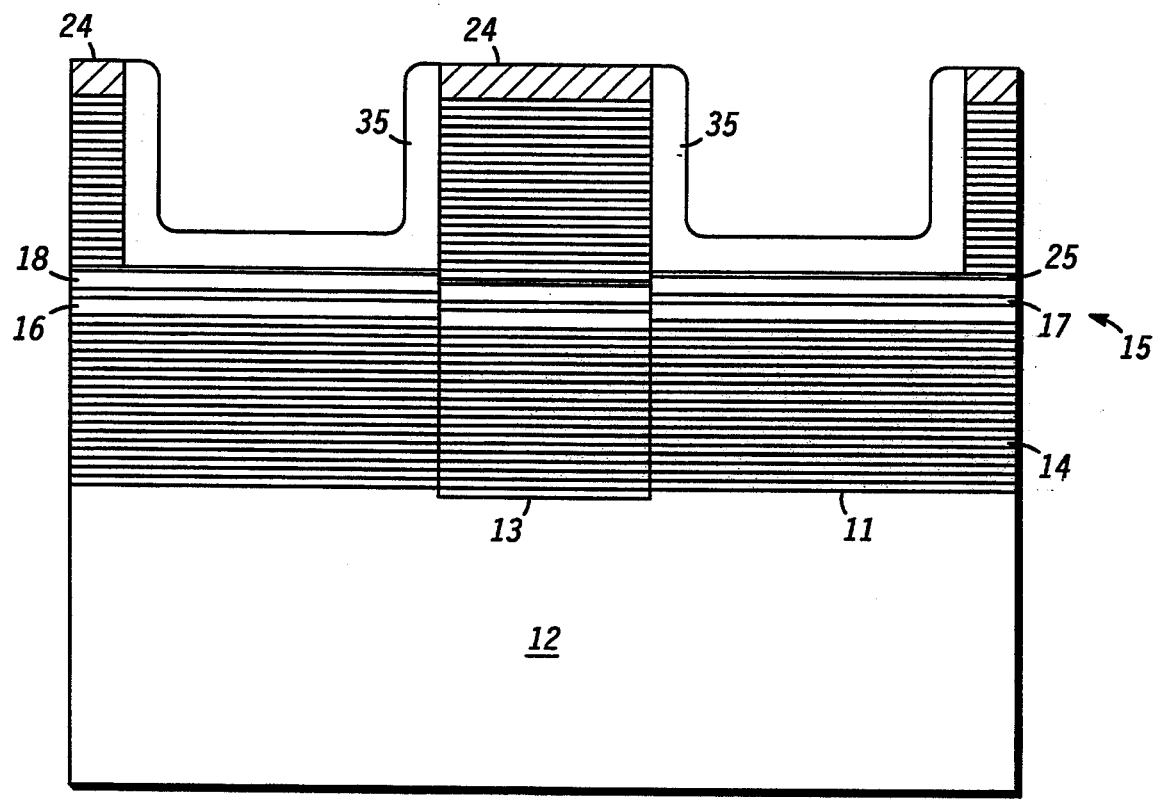

Referring specifically to FIG. 5, a layer 35 of dielectric material, which may be, for example, a convenient oxide, is formed on exposed portions of second mirror stack 19 and etch stop layer 25 (or cladding layer 18). Dielectric layer 35 serves to contain optical and electrical activity within the etched portion (mesa) of second mirror stack 19 and to reduce or eliminate higher order modes which may occur in areas surrounding the offset. Etch mask 24 is utilized to mask the structure during the formation of layer 35 and any etching of layer 35 that may be required to expose etch mask 24. It should be noted that etch mask 24 forms a good p-type ohmic contact with the upper surface of second mirror stack 19.

Figure 6:
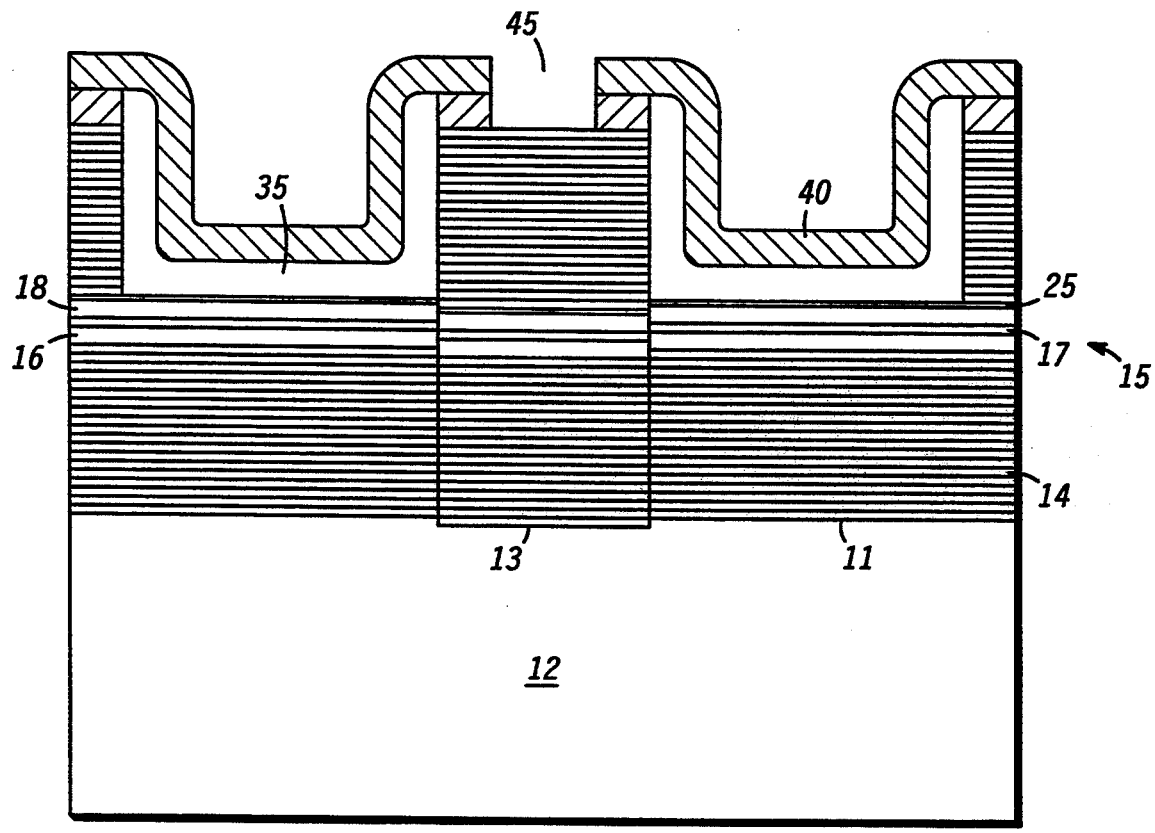

A second layer 40 of metal is formed over dielectric layer 35 and etch mask 24, so as to be in electrical contact with etch mask 24. Second layer 40 is, for example, another layer of TiWNx or any other convenient refractory metal which is utilized as one external electrical contact to the VCSEL. Layer 40 is patterned, for example by using photoresist or the like, and a window 45 is opened for a light output from the VCSEL. It should be noted that refractory metals can be used as the external electrical contacts in this VCSEL because there are no implants in the structure. While a specific electrical contact to upper mirror stack 19 is illustrated in FIG. 6, it will be understood that other contacts can be formed with mirror stacks 14 and 19, all of which can be formed with refractory metals.

Figure 7:
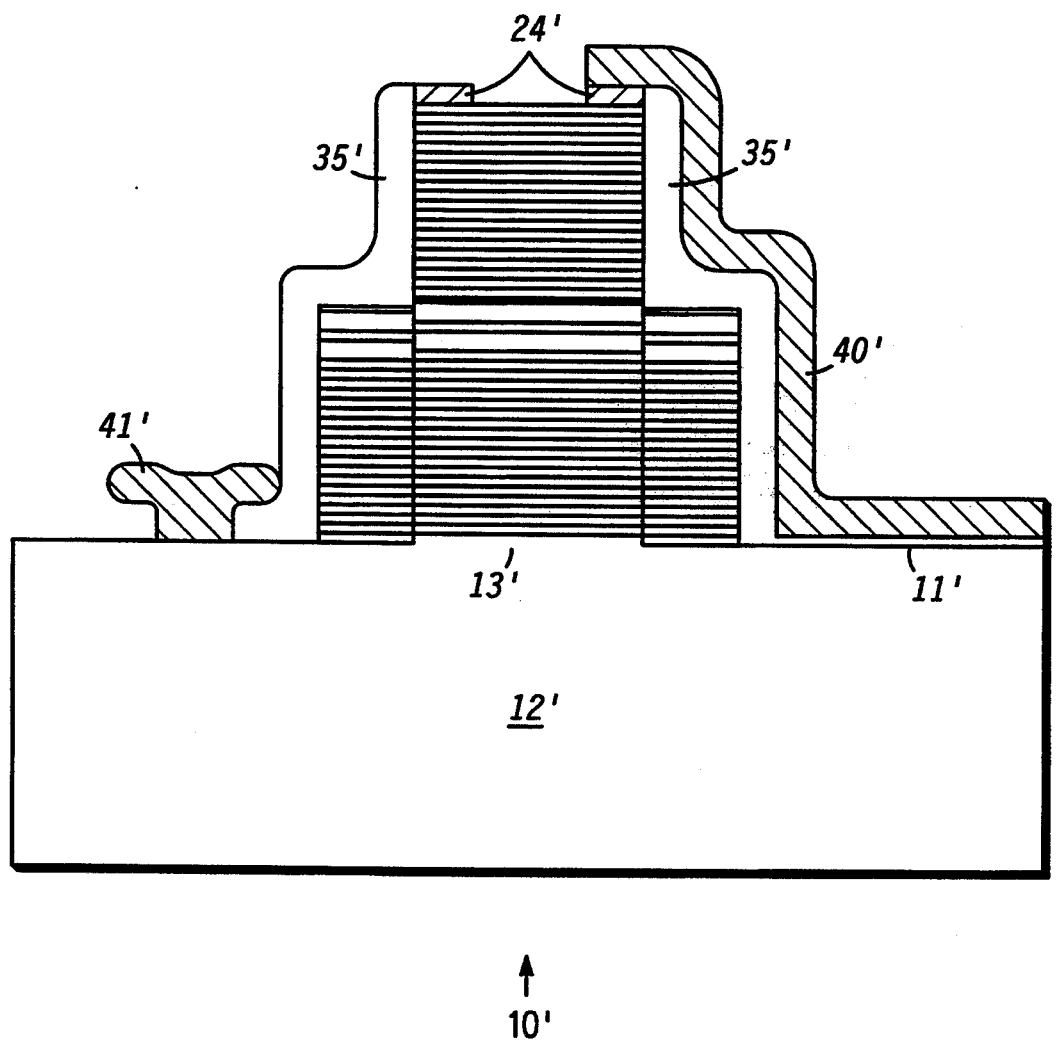
FIG. 7 is a complete view of the VCSEL of FIGS. 1 - 6.

Referring to FIG. 7, a complete embodiment of a VCSEL in accordance with the present invention is illustrated. In FIG. 7, components similar to those in FIGS. 1 - 6 are designated with similar numbers, having a prime added to indicate the different embodiment. The VCSEL of FIG. 7 is substantially similar to the prior described VCSEL, with a built in lateral waveguide produced by an offset in each of the layers, except that the offset in VCSEL 10' is produced by forming a mesa 13' in surface 11' of substrate 12', instead of a depression. The diameter of mesa 13' is approximately equal to the mode size for the lowest order of operating mode for the VCSEL and the depth is approximately one quarter wavelength (or an odd multiple thereof) at the operating wavelength of the VCSEL. Further, a second metal contact 41' is formed in contact with the lower end of the VCSEL through substrate 12'.

Thus, a VCSEL which is more efficient than prior VCSELs is disclosed. Further, a VCSEL with improved modal confinement is disclosed, which modal confinement, along with current confinement provides the improved efficiency and stable output characteristics. The modal confinement is provided by a built in lateral waveguide which significantly alleviates problems with dynamic waveguiding formed by a combination of gain, refractive index depression and thermal effects. Further, current and mode confinement in the upper mirror stack is accomplished by etching to form a mesa, rather than high energy implants. This improvement eliminates the costly requirement for high energy implants and, further, allows the external electrical contacts to be formed of etchable refractory metals, thereby eliminating the need for difficult lift-off processing.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. A vertical cavity surface emitting laser having an opening wavelength at which light emission occurs, the laser comprising:

a supporting substrate having a surface lying in a first plane and a substantially centrally located offset area of the surface lying in a second plane parallel to the first plane and spaced therefrom, the offset area defining therein a generally circular area with a diameter approximately equal to a mode size for a lowest order of operating mode for the vertical cavity surface emitting laser, and the offset area being spaced from the surface of the substrate approximately an odd multiple of a quarter wavelength of the operating frequency;

a first mirror stack positioned on the surface of the substrate so as to overlie the offset area and a portion of the surface surrounding the offset area;

an active region including at least a layer positioned parallel and in overlying abutting engagement with the first mirror stack and substantially coextensive therewith;

a second mirror stack positioned parallel and in overlying abutting engagement with the active region and substantially overlying only the offset area; and first portions of the active region and the first mirror stack being offset from second surrounding portions of the active region and the first mirror stack by the offset area in the surface of the substrate so as to define a lateral waveguide generally aligned with the second mirror stack.

2. A vertical cavity surface emitting laser as claimed in claim 1 including in addition a dielectric layer positioned in overlying relationship on exposed portions of the active layer and the second mirror stack.

3. A vertical cavity surface emitting laser as claimed in claim 2 including in addition an upper electrical contact formed of a refractory metal layer at least partially overlying the dielectric layer.

4. A vertical cavity surface emitting laser as claimed in claim 1 wherein the active region includes an active layer with overlying cladding layers positioned in abutting engagement on opposite sides thereof, the offset being large enough to position one of the cladding layers in the second surrounding portions in the same plane as the active layer in the first portion.

5. A vertical cavity surface emitting laser as claimed in claim 1 wherein the active region, including the active layer with overlying cladding layers, has a thickness of approximately a full wavelength of the laser emission in the first and second mirror stacks.

6. A vertical cavity surface emitting laser as claimed in claim 1 wherein the offset is a mesa formed in the surface of the supporting substrate.

7. A vertical cavity surface emitting laser as claimed in claim 1 wherein the offset is a depression formed in the surface of the supporting substrate.

8. A vertical cavity surface emitting laser having an operating wavelength at which light emission occurs, the laser comprising:
first and second mirror stacks with an active region sandwiched therebetween, the active region including an active layer;
a preferred operating region defined in the first and second mirror stacks and the active region with portions of the second mirror stack outside of the preferred operating region being removed, the preferred operating region defining therein a volume with a generally circular cross-section having a diameter approximately equal to a mode size for a lowest order of operating mode for the vertical cavity surface emitting laser; and
the operating region being vertically offset from portions of the first and second mirror stack and the active region which are outside of the operating region approximately an odd multiple of a quarter wavelength of the operating frequency so that the preferred operating region in the first mirror stack and at least the active layer of the active region are surrounded with portions of the first mirror stack and the active region outside of the preferred operating region having a different index of refraction so as to define a lateral waveguide in the preferred operating region.

9. A vertical cavity surface emitting laser as claimed in claim 8 including in addition a first refractory metal contact electrically connected to the second mirror stack.

10. A vertical cavity surface emitting laser as claimed in claim 9 including in addition a second refractory metal contact electrically connected to the first mirror stack.

11. A method of manufacturing a vertical cavity surface emitting laser having an operating wavelength at which light emission occurs, the method comprising the steps of:

providing a supporting substrate having a substantially planar surface;
forming an offset in the substrate and substantially centrally located in the surface, the offset defining a surface lying in a first plane and an outer edge lying in a second plane parallel to the first plane and spaced therefrom with the first and second planes being parallel to the planar surface, the offset surface defining therein a generally circular area with a diameter approximately equal to a mode size for a lowest order of operating mode for the vertical cavity emitting laser, and the first and second planes being spaced apart approximately an odd multiple of a quarter wavelength of the operating frequency;
positioning a first mirror stack on the surface of the substrate so as to overlie the offset in the substrate and a portion of the surface surrounding the offset;
positioning an active region including at least a layer parallel and in overlying abutting engagement with the first mirror stack and substantially coextensive therewith;
positioning a second mirror stack parallel and in overlying abutting engagement with the active region and substantially coextensive therewith;
further positioning the first and second mirror stacks and the active region so that first portions of the active region and the first and second mirror stacks are offset from second surrounding portions of the active region and the first and second mirror stacks, respectively, by the offset in the substrate so as to define a lateral waveguide; and
removing portions of the second mirror stack overlying the portions of the surface surrounding the offset in the substrate.

12. A method as set forth in claim 11 wherein the step of removing portions of the second mirror stack overlying the portions of the surface surrounding the offset in the substrate is performed by etching.

13. A method as set forth in claim 12 wherein the step of removing portions of the second mirror stack overlying the portions of the surface surrounding the offset in the substrate includes forming a mask on the second mirror stack to define portions of the second mirror stack to be removed, prior to etching.

14. A method as set froth in claim 13 wherein the step of forming a mask on the second mirror stack to define portions of the second mirror stack to be removed includes depositing a layer including TiWNx on the second mirror stack and removing all of the layer except a portion overlying the offset in the substrate.

15. A method as set forth in claim 14 wherein the step of removing portions of the second mirror stack overlying the portions of the surface surrounding the offset in the substrate is performed by reactive ion etching unmasked portions of the second mirror stack.

16. A method as set forth in claim 11 wherein the step of forming an offset in the substrate includes etching the surface of the substrate to provide a mesa as the offset in the substrate.

17. A method as set froth in claim 11 wherein the step of forming an offset in the substrate includes etching the surface of the substrate to provide a depression as the offset in the substrate.

18. A method as set forth in claim 11 wherein the step of forming an offset in the substrate includes forming the offset approximately an odd multiple of one quarter wavelength of the operating wavelength.

19. A method as set froth in claim 11 wherein the step of positioning an active region includes positioning an active layer with parallel abutting overlying cladding layers on opposite sides thereof.

20. A method as set froth in claim 19 wherein the step of positioning an active region includes positioning an active layer with parallel abutting overlying cladding layers on opposite sides thereof, the total active region having a thickness of approximately a full wavelength of the laser emission in the first and second mirror stacks.

21. A method of manufacturing a vertical cavity surface emitting laser having an operating wavelength at which light emission occurs, the method comprising the steps of:

proviking a supporting substrate having a substantially planar surface;

forming an offset in the substrate and substantially centrally located in the surface of the substrate, the offset in the substrate defining an offset surface lying in a first plane and an outer edge lying in a second plane parallel to the first plane and spaced therefrom with the first and second planes being parallel to the planar surface, the offset surface defining therein a generally circular area with a diameter approximately equal to a mode size for a lowest order of operating mode for the vertical cavity surface emitting laser, and the first and second planes being spaced apart approximately an odd multiple of a quarter wavelength of the operating frequency;

positioning a first mirror stack on the surface of the substrate so as to overlie the offset in the substrate and a portion of the surface surrounding the offset;

positioning an active region including at least a layer parallel and in overlying abutting engagement with the first mirror stack and substantially coextensive therewith;

positioning a second mirror stack parallel and in overlying abutting engagement with the active region and substantially coextensive therewith;

further positioning the first and second mirror stacks and the active region so that first portions of the active region and the first and second mirror stacks are offset from second surrounding portions of the active region and the first and second mirror stacks, respectively, by the offset in the surface of the substrate so as to define a lateral waveguide; and removing portions of the second mirror stack overlying the portions of the surface surrounding the offset in the substrate using the steps of forming a mask on the second mirror stack to define portions of the second mirror stack to be removed by depositing a layer including TiWNx on the second mirror stack and removing all of the layer except a portion overlying the offset in the substrate and plasma etching unmasked portions of the second mirror stack.

22. A method as set forth in claim 21 wherein the step of positioning an active region includes depositing a stop etch layer between the active region and the second mirror stack.

23. A method as set froth in claim 22 wherein the step of depositing a stop etch layer between the active region and the second mirror stack includes forming a layer between 50 and 200 A thick including one of InGaAs, InGaAlAs, InAlAs and InGaP.

24. A method of manufacturing a vertical cavity surface emitting laser having an operating wavelength at which light emission occurs, the method comprising the steps of:

providing a supporting substrate having a substantially planar surface;

forming an offset in the substrate and substantially centrally located in the surface of the substrate, the offset in the substrate defining an offset surface lying in a first plane and an outer edge lying in a second plane parallel to the first plane and spaced therefrom with the first and second planes being parallel to the planar surface, the offset surface defining therein a generally circular area with a diameter approximately equal to a mode size for a lowest order of operating mode for the vertical cavity surface emitting laser, and the first and second planes being spaced apart approximately an odd multiple of a quarter wavelength of the operating frequency;

positioning a first mirror stack on the surface of the substrate so as to overlie the offset in the substrate and a portion of the surface surrounding the offset;

positioning an active region including at least a layer parallel and in overlying abutting engagement with the first mirror stack and substantially coextensive therewith;

positioning a second mirror stack parallel and in overlying abutting engagement with the active region and substantially coextensive therewith;

further positioning the first and second mirror stacks and the active region so that first portions of the active region and the first and second mirror stacks are offset from second surrounding portions of the active region and the first and second mirror stacks, respectively, by the offset in the surface of the substrate so as to define a lateral waveguide;

removing portions of the second mirror stack overlying the portions of the surface surrounding the offset in the substrate using the steps of forming a mask on the second mirror stack to define portions of the second mirror stack to be removed by depositing a layer including TiWNx on the second mirror stack and removing all of the layer except a portion overlying the offset in the substrate; and forming a dielectric layer over all exposed portions of the second mirror stack.

25. A method as set froth in claim 24 including in addition a step of depositing a layer of refractory metal on the dielectric layer and in contact with the layer including TiWNx on the second mirror stack.

26. A method as set forth in claim 25 including in addition a step of removing all material on a surface of the second mirror stack approximately centrally located over an end of the lateral waveguide to form a light output.

* * * * *